(12) United States Patent
Karins et al.

(10) Patent No.: US 6,583,612 B2
(45) Date of Patent: Jun. 24, 2003

(54) STATIC EVENT DETECTION/PROTECTION DEVICE

(76) Inventors: James P. Karins, 12467 Hillside Dr., Moorpark, CA (US) 93021; Niels F. Jacksen, P.O. Box 4094, Cave Creek, AZ (US) 85331

( * ) Notice: Subject to any disclaimer, the term of this patent is extended or adjusted under 35 U.S.C. 154(b) by 184 days.

(21) Appl. No.: 09/755,712

(22) Filed: Jan. 5, 2001

(65) Prior Publication Data

US 2001/0004208 A1 Jun. 21, 2001

Related U.S. Application Data

(62) Division of application No. 08/714,411, filed on Sep. 16, 1996, now Pat. No. 6,172,496.
(60) Provisional application No. 60/003,894, filed on Sep. 18, 1995.

(51) Int. Cl.[7] .......................... G01R 15/24; G01R 15/28
(52) U.S. Cl. ............................ 324/96; 324/72; 324/102
(58) Field of Search .......................... 324/96, 72, 102, 324/103 P, 122, 133, 244.1; 340/600; 345/86; 359/280, 282, 295

(56) References Cited

U.S. PATENT DOCUMENTS

| | | | | |
|---|---|---|---|---|
| 4,550,983 A | * | 11/1985 | Ross | 359/282 |
| 4,661,809 A | * | 4/1987 | Anderson et al. | 345/86 |
| 4,928,067 A | * | 5/1990 | Lind | 324/96 |
| 4,947,107 A | | 8/1990 | Doerfler et al. | 324/96 |
| 5,241,412 A | | 8/1993 | Ross | 359/280 |
| 5,255,119 A | | 10/1993 | Ross et al. | 359/280 |
| 5,315,255 A | | 5/1994 | Bettinger | 324/457 |
| 5,359,319 A | | 10/1994 | Campbell et al. | 340/649 |
| 5,376,879 A | | 12/1994 | Schrimpf et al. | 324/72 |
| 5,535,047 A | | 7/1996 | Hornbeck | 359/295 |

* cited by examiner

*Primary Examiner*—Ernest Karlsen
(74) *Attorney, Agent, or Firm*—Fulwider Patton Lee & Utecht, LLP

(57) ABSTRACT

A reusable miniaturized detector that utilizes magneto-optic elements to detect the occurrence of an electrostatic discharge during the manufacture or handling of electrostatic discharge sensitive electronic components and circuit boards. The device may also be used to determine the polarity and magnitude of the electrostatic discharge. The device may be manually or automatically read, either by removing the device from the environment being monitored or continuously monitoring in situ. The device can also be configured to provide protection to some electrostatic discharge events which could damage sensitive components being monitored.

1 Claim, 1 Drawing Sheet

STATIC EVENT DETECTION/PROTECTION DEVICE

This is a divisional application of application of Ser. No. 08/714,411 filed Sep. 16, 1996, now U.S. Pat. No. 6,172,496 issued Jan. 9, 2001.

RELATED APPLICATIONS AND PRIORITY DOCUMENTS

This application claims the benefit of U.S. Provisional Application Serial No. 60/003,894, filed Sep. 18, 1995, which is incorporated herein by reference.

BACKGROUND OF THE INVENTION

1. Field of the Invention

This invention relates generally to new and improved devices for detecting electrostatic discharge (ESD) events occurring in electronic components and electronic assemblies and, more particularly, to reusable detectors which can be positioned directly on or closely adjacent to miniature electronic components and printed circuit board assemblies to detect the occurrence, polarity and approximate magnitude of an ESD event. The invention also relates to devices to protect electronic components and circuits from static discharge, in that the invention can be connected to an electrostatic discharge sensitive device so that ESD events above a predetermined magnitude would result in the destruction of the apparatus of the invention, rather than the ESD sensitive device.

2. Description of the Related Art

Static charges may accumulate on the surfaces of non-grounded conductors and non-conductive surfaces such as most plastics and textiles. These charges will usually remain on the surfaces because there is no path to ground. When a non-grounded conductor comes close to a grounded plane, a spark of high voltage, and potentially destructive low current, will "leap" from a point on the non-grounded conductor to the grounded object, causing an electrostatic discharge (ESD) event. When a charged non-conductor comes close to a conductive object, the charge can be induced onto the conductor, which can then rapidly discharge to other conductors.

Electrostatic discharge occurs in many industrial situations, such as manufacturing and assembly processes, electronic testing processes and the like. For example, in the manufacture of semiconductor devices, electrostatic charges may build up and become discharged during various human or machine handling operations wherein semiconductor wafers are processed, tested and packaged. The amount of electrostatic charge accumulated and discharged during handling of work pieces can be sufficiently high to cause a significant number of component failures, reducing the yield of the various manufacturing, testing and packaging operations and thereby increasing the overall cost of the device.

Static electricity can create a wide variety of problems for electronic manufacturers. An ESD event can cause a rapid electron movement through the microscopic conductive paths within a device and generate a heat spike which can cause damage to the gates or other insulating parts of the electronic device. If the discharge is large enough, a portion of the device will be destroyed and the defect will be found during testing. While high levels of electrostatic discharge will result in the immediate destruction of the device, which can be readily discovered during subsequent testing, low level electrostatic discharge may cause latent damage to the device, which may not be detected during initial testing. This latent damage may later result in reduced performance and/or premature product failure.

At present, efforts have been directed toward prevention of ESD events during manufacturing, since there are few known methods to monitor actual events. Knowing where, how large, and when an event occurs is useful in evaluating ESD induced failures so that appropriate preventive measures can be taken to eliminate the source of the ESD event.

Improvements in the manufacture of semiconductor devices have resulted in devices having vastly increased circuit density, reduced active element size and reduced conductor widths. These improvements have increased the overall performance of the devices, but have simultaneously increased the susceptibility of the devices to damage from electrostatic discharge. As a result, electronic devices are potentially susceptible to damage from discharge events as low as 50 volts. Thus, semiconductive devices in routine manufacture and use today are more susceptible than humans, who normally can not feel an electrostatic discharge of less than approximately 3500 volts.

A variety of instruments have been designed and developed to measure electrostatic phenomena in semiconductor device assembly areas. Some of these devices are connected directly to the circuit boards, while other instruments have antennas or other sensors that detect electromagnetic radiation resulting from an electrostatic discharge. In general, these instruments suffer from one or more disadvantages that limit their acceptance and use in the electronic industry, and similar industries. These disadvantages include being too large or expensive, difficult to monitor in real time, and non-reusable, or some combination of these drawbacks. These prior art instruments also generally fail to provide sufficient information to assist in the detection of devices that are damaged or destroyed, including information leading to the detection and elimination of the incipient environmental causes of the ESD events.

One prior art device used to detect ESD events utilizes a silicon Field Effect Transistor (FET) which is destroyed in the process. This device is monitored by first removing it from the circuit board and then inserting it into an external reader. This device has inherent disadvantages which include its inability to be reused, the requirement that it be removed from the circuit to be tested, its inability to measure polarity, and its limited range of one ESD sensitivity level per device.

Other prior art detection devices are known which utilize a liquid crystal display as an indicator and has a clip lead which can be connected to the particular position of interest, e.g., input to an ESD sensitive device. This particular device has a built-in antenna which senses the ESD event and includes hardware for mounting and protecting the device while in use. This device also has inherent disadvantages which include the large size of the unit, its low operating/storage temperature range, its ability to detect only one transient voltage, and the high cost in manufacturing the unit. Additional disadvantages include incompatibility with automatic insertion equipment and the inability of the device to measure polarity.

What has been needed, and heretofore unavailable, is a reliable, low cost, rugged, miniature, reusable device for accurately and economically detecting the occurrence, polarity and magnitude of electrostatic discharge events, including relatively low level events, which can also provide protection to semiconductive devices from large electrostatic discharges. Such a device should be capable of memory retention, so that the occurrence of an ESD event can be detected anytime after it happens. The present invention satisfies these and other needs.

SUMMARY OF THE INVENTION

The present invention is directed to a reusable, miniaturized magneto-optic device that detects the current of an electrostatic discharge which may occur during the manufacture, handling or use of electrostatic discharge sensitive components and circuit boards. The present invention also may be used to determine the polarity and magnitude of an electrostatic discharge event. A device made in accordance with the present invention may be manually or automatically read, either by removing the device from the environment being monitored or monitoring the device in situ. The present invention can also be used as a protection device which can be connected to an electrostatic discharge sensitive component to protect it from electrostatic discharge events above a predetermined magnitude.

The electrostatic discharge event detector of the present invention employs the magneto-optic Faraday effect to detect electrical transients. The Faraday effect is a scientific principle which causes the plane of polarization of a polarized beam of light passing through a transparent substance exhibiting the Faraday effect to rotate from the plane of polarization of the incident light by an amount proportional to the magnetic field passing through the substance parallel to the optical axis of the beam of light. Magneto-optic materials exhibiting the Faraday effect are electrically addressable and change or "switch" the direction of magnetization of a magnetic material formed into individual elements, or pixels, through electrical conductors or drive lines that establish a magnetic field having a different direction of magnetization to the initial state. When a magnetic field is established having strength equal to or greater than a predetermined value, the reversal of the direction of magnetization, or switching, occurs.

The electrostatic discharge event detector of the present invention includes a conductor and at least one magneto-optic pixel located adjacent to the conductor which has a first magnetic state and which is capable of switching to a second magnetic state in response to a magnetic field having a field strength that exceeds a predetermined field strength at the location of the magneto-optic pixel. This magneto-optic pixel is capable of switching from its first magnetic state to its second magnetic state when an electrostatic discharge induces a current to flow through the conductor which is of sufficient strength to generate a magnetic field around the conductor that exceeds the predetermined field strength. Afterwards, the magneto-optic pixel can be observed to determine whether it has been switched from its first magnetic state to the second magnetic state which would indicate that an electrostatic discharge event has been experienced and detected by the magneto-optic pixel.

In a presently preferred embodiment, the electrostatic discharge event detector of the present invention also may include a second magneto-optic pixel having a first magnetic state and having the capability of switching to a second magnetic state in response to a magnetic field. This second magneto-optic pixel would be located next to the conductor on a side opposite from the first magneto-optic pixel. As a result, the detector would utilize a pair of magneto-optic pixels located on opposite sides of the conductor which can be used to determine the polarity, or direction, of the current flow of the electrostatic discharge event. Such a determination may prove important in analyzing the electrostatic discharge event, as it can indicate on which surface the electrostatic charge was accumulating.

A further embodiment of the present invention provides information about the magnitude of the electrostatic discharge event, provided it exceeds a minimum magnitude. In this particular embodiment, the ESD detector includes a set of pixels which are arranged in an array around a conductor. Each magneto-optic pixel is separated from the conductor by a distance which is different from any other pixel. Since the strength of the magnetic field surrounding the conductor is inversely proportional to the distance from the conductor where the magnetic field strength is measured, the different pixels will have altered magnetic states dependent upon the strength of the magnetic field at each location. Since the strength of the magnetic field is related to the magnitude of the current flowing through the conductor induced by the electrostatic discharge event, by observing which pixels have altered magnetic states, one can determine the voltage of the ESD event. Additionally, the pixels can be placed in pairs on opposite sides of the conductor to determine polarity.

The readout of the electrostatic discharge event detector can be achieved either manually by observing the reflected light through a polarizing microscope or automatically using a version of a pattern recognition instrument. In either case, it is not necessary to physically contact the ESD detector of the present invention. Since an ESD event would form patterns or switched regions depending on the polarity and the voltage of the event, a readout unit could be placed adjacent to the detector, allowing each electro-static discharge event to be recorded. Alternatively, the detector can be observed continuously to record the time and conditions of each ESD event. A record of the static events could then be linked to a computer for statistical process control.

After the detection of an ESD event, the detector of the present invention would need to be reset, i.e., the active region would have to be returned to its initial condition. This can be accomplished with an externally packaged reset instrument which uses external magnetic fields induced by an electromagnetic coil or permanent magnet to "reswitch" the magneto-optic pixels of the detector. The operation of the reset function is determined by the same magneto-optic effect that determines the sensitivity of the detector to an ESD event. An electromagnet of sufficient field strength and uniformity can be used to reset the device by subjecting the detector to a short pulse which resets the magnetic state of each magneto-optic pixel.

The present invention is also directed to a method for detecting the occurrence of electrostatic events utilizing a magneto-optic detector as the ones herein described. Other methods of the present invention are directed to detecting the polarity and the magnitude of the electrostatic discharge event.

The present invention provides a reliable, low cost miniature detector for accurately and economically detecting the occurrence, polarity and magnitude of electrostatic discharge events, including relatively low level events. The present invention is rugged and relatively inexpensive, allowing the device to be utilized with electronic components and circuit board assemblies to detect ESD events. Additionally, the present invention can also be connected to an electrostatic discharge sensitive component to prevent the component from being destroyed in the event of a sufficiently high ESD event. In such an embodiment, the invention is constructed such that the conductor for conducting the ESD charge will be destroyed by an ESD event over a threshold chosen to protect the device being maintained from destruction. However, the protection mode of the present invention is not reusable as it acts as a fuse to protect the ESD sensitive device from possible damage. These and other features and advantages of the invention will become apparent from the following detailed description, when taken in conjunction with the accompanied exemplary drawings.

DESCRIPTION OF THE PREFERRED EMBODIMENTS

The invention relates to a system for detecting and evaluating the occurrence, polarity and magnitude of electrostatic discharge (ESD) events. As described herein, reference will be made to numerous specific details, such as the composition of magneto-optic devices and the effect of an induced magnetic field on the magnetic and optical properties of such devices, in order to more fully describe the invention. However, it should be apparent to one skilled in the art that the present invention is not limited to the exemplary components described, nor their specific arrangements provided for the purposes of illustration.

In the present invention, several embodiments of a novel magneto-optic device are described for detecting and evaluating the occurrence of an ESD event. These novel devices are also capable of providing additional information not previously available which allows further characterization of the ESD event, thus aiding in the elimination of the causes of such events from the environment in which the occurrence of an ESD event can lead to the destruction or damage of ESD sensitive devices. Furthermore, if properly configured, the invention is capable of providing protection against an ESD event.

Figure 1:
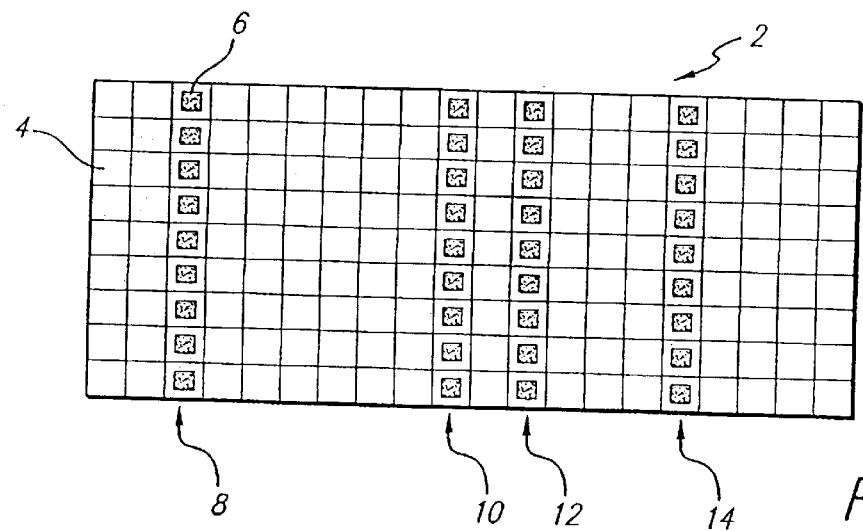
FIG. 1 is a plan view of a magneto-optic array of the present invention.

Referring first to FIG. 1, one presently preferred embodiment of an array of the magneto-optic devices of the present invention is depicted. In this embodiment, a number of magneto-optic devices are arranged in a geometric pattern, or array 2, wherein each magneto-optic device forms pixels 4 and 6. These pixels have three stable magnetic states: magnetized up, normal to the surface of the array (the z-direction); magnetized down (also in the z-direction, but into the surface of the array); and demagnetized, in which there are equal amounts of regions within the pixel that are magnetized up or down. FIG. 1 shows pixel 4 as a bright, or unswitched pixel. Pixel 6 shows a darkened pixel which has been switched as a result of an ESD event. The particular manner in which the pixels 4 and 6 are affected by an ESD event is described in greater detail below.

When a conductor, such as a wire, lead or gate carries a current, a magnetic field is induced around the conductor. The strength of the magnetic field will be directly proportional to the level of the current carried by the conductor. Where the conductor is in close proximity to the array 2, this magnetic field, if it reaches a critical level in the region of the pixel, will cause the pixel to change magnetic states. That is, if the pixels 4 and 6 are originally magnetized in the up or down states, a sufficient magnetic field induced by the current carried in the conductor will cause pixels located sufficiently close to the conductor to demagnetize if the strength of the magnetic field exceeds the critical level.

Demagnetization, or switching magnetic states, of the pixels is a two part process. First, the magnetic field causes nucleation of a domain wall. The domain wall then propagates throughout the pixel resulting in complete saturation of the pixel and a change in magnetic state. A magnetic domain wall is established by nucleation at a nucleation site within the magnetic material of the selected pixel element. This domain wall is formed between the initial condition of magnetization and the nucleated opposite magnet condition. The remainder of the element is switched by propagating the domain wall through the thickness of the pixel element so that part or all of the entire element exhibits a direction of magnetization opposite to the initial condition.

It is well known in the art that the magnetic field required for nucleation is greater than that required for propagating the domain wall, because domain wall motion is limited by demagnetizing and coercivity effects. The field established by the selected conductors diminishes rapidly as the distance from the conductors increases. Thus, the value or strength of the magnetic field adjacent to the energized conductors may be quite large, while the field in the region of pixels farthest from the energized conductor will be relatively small.

Due to the Faraday effect, the plane of polarization of a beam of light passing through a magneto-optic pixel is dependent upon the magnetic state of the pixel. The effect of a magnetic field passing through a conductor upon the magnetic state, and subsequent optical state, of a pixel is seen in FIG. 1. In this figure, conductors (not shown) lie adjacent to several rows of switched pixels 8–14. These rows 8–14 depict a row of conductor paths caused by an ESD event. The pixels 4 and 6 of array 2 were originally magnetized in a uniform direction. An ESD current was induced in the conductors, resulting in demagnetization of the pixels in the vicinity of the conductors so that the magnetic field in the region of the pixels exceeded the critical level, initiating nucleation in the pixels and a change of their magnetic state. FIG. 1 depicts the view as seen through a polarizing microscope (not shown) of light reflected by the pixels 4 and 6 of array 2. In FIG. 1, light reflected by pixels in their original, magnetized state, as depicted by pixel 4, is rotated by the magnetic state of the pixel, and appear bright under the polarizing microscope. Pixel 6, which is adjacent to the path of the conductors, have been demagnetized by the ESD induced current in the conductor, and thus appears darkened when viewed under the polarizing microscope. The rows of pixels 8–14, likewise, appear as darkened regions since they too have been switched by the ESD event.

An important advantage of the present invention over prior art ESD sensors is the capability to be reused. As should be apparent, reset of switched pixels 6 can be accomplished by subjecting the array 2 to a magnetic field of sufficient strength to switch the magnetic state of the demagnetized pixels back to the original state present before the ESD event.

The sensitivity of detection of ESD events by the present invention is dependent upon the ESD current levels desired to be detected and the current level desired to be protected against. The minimum detectable current, i.e., the minimum current that will generate a magnetic field of sufficient strength to induce a change in the magnetic state of the pixels adjacent to the conductor, is determined by the integrated distance from all locations of the conductor to the nucleation site of the pixel and the angle between the Z-axis of the pixel and a line between the center of the conductor and the nucleation site. In other words, the minimum detectable current is determined by the z-component of the magnetic field. The nucleation site of an individual pixel will be the location in the array where the z-component of the magnetic field is a maximum, and is a function of the geometry of the conductor and the relative position of the conductor with respect to the pixel.

The protection level of the present invention is determined by the current-carrying capability of the conductor. In the present invention, the current-carrying capacity of the conductor is a function of the conductor material, the thickness of the conductor, and the width of the conductor. Unlike the detection sensitivity, the protection level is independent upon the location of the conductor with respect to the pixel.

There are at least five variables available to the designer of a device according to the present invention that allow the design and manufacture of devices having a wide range of performances to suit a variety of uses. These variables include: (a) conductor material, (b) width of the conductor (generally limited only to the photolithographic capabilities of the fabrication facility), (c) thickness of the conductor (limited by deposition techniques and photolithographic capabilities of the facility), (d) the distance from the center of the conductor to the nucleation site (the minimum value of which is the thickness or width of the conductor), and (e) magneto-optic material properties.

In its simplest embodiment, the present invention comprises an array of magneto-optic pixels 6 centered under a conductor (not shown) lying along conductive path 8. The conductor may be insulated from the array 2 by an insulating layer deposited during manufacture of the device. Alternatively, the conductor may be either buried in the magneto-optic film or lie at the same level as the magneto-optic film forming the pixel 6.

Figure 2:
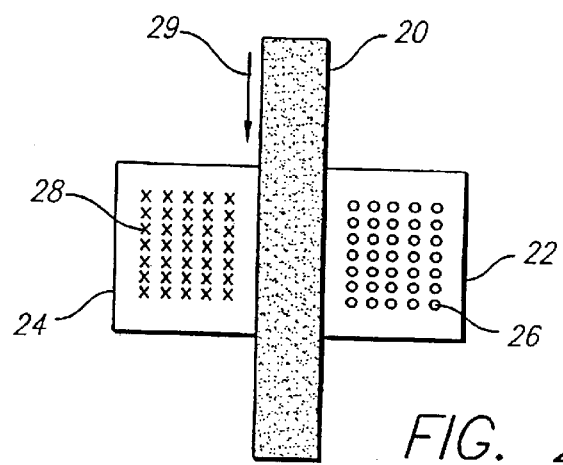
FIG. 2 is a plan view of a portion of the array of FIG. 1 showing a pair of magneto-optic pixels located on opposites of a conductor.

An alternative embodiment of the present invention is depicted in FIG. 2. In this embodiment, a pair of magneto-optic pixels 22 and 24 are located on each side of a conductor 20. This embodiment of the present invention allows the determination of the polarity, or direction of current flow, of the ESD event. Such a determination may be important in analyzing the ESD event, as it can indicate on which surface the electrostatic charge was accumulating. Knowing this fact would aid engineers in eliminating the environmental factors causing the accumulation of static charge, or in providing suitable grounding connections for the circuits, circuit assemblies or handlers.

Referring again to FIG. 2, if the pixels 22 and 24 are initially magnetized such that the direction of magnetization is in a direction into the page, a positive current flowing through the conductor 20 in the direction of arrow 28 will result in a magnetic field around the conductor 20 whose magnetic lines of force are directed into the page in the area of pixel 24, as depicted by the Xs 28 within pixel 24 and out of the page in the area of pixel 22, as depicted by the Os 26 within pixel 26. As described previously, the original magnetic state of pixel 24 is magnetized in the direction out of the page; thus application of the magnetic field resulting from current flow in conductor 20 in the direction of arrow 29 does not induce a change in the magnetic state of pixel 24. The direction of the magnetic field in the area of pixel 22, however, is into the page, or opposite the original magnetic state of pixel 22. If the strength of the magnetic field in the area of pixel 22 exceeds the critical value required to induce nucleation in pixel 22, the magnetic state of pixel 22 will change. This change in state will be readily apparent when pixels 24 and 22 are viewed under a polarizing microscope.

As will be apparent to one skilled in the art, if the direction of current flow in conductor 20 is in the opposite direction to that indicated by arrow 29, application of the magnetic field resulting from current flow in conductor 20 in the opposite direction of arrow 29 will also result in the opposite case to that described above. The direction of the magnetic lines of force will be into the page in the area of pixel 22, and out of the page in the area of pixel 24. If the strength of the magnetic field in the area of pixel 24 exceeds the critical value required to induce nucleation in pixel 24, the magnetic state of pixel 24 will change.

While the embodiment of the present invention depicted in FIG. 2 is useful in determining the polarity of an ESD event, the event will only be detected if the current flowing through the conductor 20 is sufficient to generate a magnetic field with a strength exceeding the critical threshold required to cause a change in the magnetic state of pixels 22 and 24. Thus, such a detector indicates that an ESD event having some minimum magnitude has occurred, but provides no information regarding how large the ESD actually was.

Figure 3:
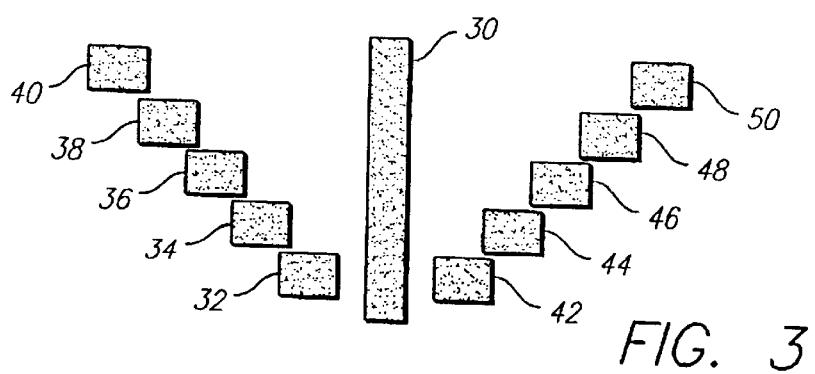
FIG. 3 is a plan view of a magneto-optic array showing an array of the pairs of magneto-optic pixels of FIG. 2.

A further embodiment of the present invention that is capable of providing information about the magnitude of the ESD event, beyond a minimum magnitude, is depicted in FIG. 3. In this embodiment, the detector comprises a set of pixels, such as pixels 32–40, that are arranged in an array next to conductor 30. As depicted, each pixel is separated by different distances than any other pixel. Since the strength of the magnetic field which surrounds the conductor 30, caused by the individual current flowing through the conductor 30, is inversely proportional to the distance from the conductor 30 at the point the magnetic field strength is measured, different pixels will have altered magnetic states dependent on the strength of the magnetic field, which is related to the magnitude of current flowing through the conductor 30 induced by the ESD event. Pixels 42–50 can be added on the opposite side of conductor 30 to provide capability of determining polarity.

For example, if it is desired to know the voltage and polarity of the ESD event to within 50 volts (V) for a particular line resistance, the first pair of pixels 32 and 42 would be separated by a distance sufficient to ensure that the magnetic field generated by a 50 V current flowing through the conductor 30 would be sufficient strong to induce a change in the magnetic state of one of pixels 32 and 42. The second pair of pixels 34 and 44 would be separated by a distance that would require a magnetic field strength resulting from a 100 V current flowing through the conductor 30 before the pixels 34 and 44 would change magnetic state. The number of pairs of pixels is limited only by the requirements of the designer, that is, by the maximum voltage ESD event that is desired to be detected. It should be noted that the geometry depicted in FIG. 3 is for illustrative purposes only; the location of the nucleation sites in the various pixels is dependent upon the geometry of the array and the location of the conductor 30. These factors are easily accounted for in the design of the device, and will be apparent to one skilled in the art.

An alternative approach to providing a detector that is capable of determining the magnitude of an ESD event would be to use the configuration depicted in FIG. 2, but connecting a number of pairs of pixels in parallel using conductors 20 having different line resistances in each pair of pixels. For example, if the line resistances of the conductor 20 of two pixel pairs were 500 and 1000 ohms, an ESD event of 100 V would cause currents of 200 ma and 400 ma to flow in the conductor 20 respectively. Since the strength of the magnetic field is proportional to the magnitude of the current flowing through the conductor 20, a pixel pair that requires a magnetic field strength greater than can be generated by a current of 200 ma will not change states during the 100 V ESD event.

Typically, the present invention, including, but not limited to the various embodiments described above, are fabricated from a magneto-optic film which is grown using well known fabrication techniques on a non-magnetic substrate. The fabrication process will vary depending upon the geometry of the devices, and particularly depending on the location of the conductors in relation to the pixels. For example, a different process may be required depending on whether the detector is designed with the conductor passing over the top of the magneto-optic region, or whether the conductor passes next to the magneto-optic region.

In fabricating a detector where the conductor passes over the magneto-optic film, a magneto-optic epitaxial film is deposited on a wafer using techniques well known in the semiconductor industry. Alignment marks for aligning masking levels in subsequent fabrication steps are then photolithographically defined and machined into the magneto-optic film using an ion beam. The wafer is photolithographically defined and masked using a standard photoresist to accept an ion implanted dopant, such as boron, into the regions of the wafer where bubble nucleation and/or collapse is desired, reducing the magnetic fields necessary for inducing a change of magnetic state in the desired magneto-optic regions by approximately an order of magnitude.

The magneto-optic layer is segmented by laying out a desired segmentation pattern using a photoresist etch mask, followed by ion beam milling or chemical etching. An insulator material is then deposited on the surface of the magneto-optic layer to provide proper separation between the conductor and the nucleation site in the magneto-optic layer. The wafer may then be metallized and patterned to produce the desired electrode patterns for ESD detection and protection and for subsequent electrical interconnection. The metallized pattern also acts as a reflector for the backside illumination and reading of the magnetization state of the magneto-optic pixels. A similar fabrication process is used to fabricate detectors with the conductor located next to the magneto-optic pixels, with the exception that no insulation layer is necessary between the conductor and the magneto-optic layer. Suitable materials for the conductor include aluminum, aluminum alloys and palladium.

For example, the device can be fabricated on an epitaxial film grown on a Czochralski non-magnetic garnet substrate. The single crystal boule is sliced and polished into high optical quality 0.25 mm thick substrate wafers. These substrates are transparent, non-magnetic single crystals and are basically $Gd_3Ga_5O_{12}$ doped with Ca, Mg, and Zr to increase the size of the crystal lattice so that the crystal can accommodate a large amount of bismuth in the magnetic iron garnet film which is grown epitaxially on the substrate. The bismuth enhances the Faraday rotation of the film.

The packaging of the device is determined by its desired final use, that is, as a permanent component in an electronic circuit or as a temporary monitor during certain fabrication/testing steps. The device may be passivated to protect against environmental degradation of the conductor and isolation resistances using typical well known passivation techniques. Electrical connection to the device could be made by any of the methods well known and commonly used in the semiconductor industry such as wire bonding or bump bonding. Connection pads may be exposed through the passivation layer, and additional metal may be deposited if needed to facilitate interconnection. The wafer may be diced, cleaned and inspected using standard semiconductor techniques, and the individual die may then be attached to a suitable substrate, or alternatively, directly to a circuit using standard hybridization techniques.

In practice, the device may be packaged in a TO-18 or equivalent package for leaded insert into an appropriately fabricated circuit board. The lid would have a transparent window to allow the magnetic state of the detector to be read by an analyzer. The device can be manufactured in dimensions as small as about 0.5 mm by 0.5 mm, with a thickness as small as about 0.3 mm.

The device may also be packaged in a surface mount package for insertion onto hybrids, multi-chip modules or surface mounted circuit boards. This configuration may also require a window to allow the magnetic state of the detector to be read. Another alternative is to package the detector in a plastic clip lead package which provides a low cost hermetic package for external monitoring that would not require a window to allow the magnetic state of the detector to be read by an analyzer.

ESD events that are monitored by the detector will cause patterns of pixels to change their magnetic states in response to the magnetic fields generated within the conductors by the ESD event. Reading the magnetic state of the pixels of the detector may be accomplished by observing light reflected by the pixel through a polarizing microscope, as described previously. Alternatively, a pattern recognition unit may be provided to automatically scan the pixels and determine their magnetic states, and record the patterns for analysis. If desired, the detectors may be fashioned to allow for continuous monitoring. The pattern detector or other automatic magnetic state reader may also be connected to a computer. Such a connection would allow the information provided by the detector to be used for statistical process control.

After the detection of an ESD event, and subsequent reading of the detector, either manually or automatically, the pixels of the detector may be reset. This resetting of the pixels requires that the pixel array be subjected to a uniform magnetic field of sufficient strength to induce a change in the magnetic state of those pixels that were switched by the ESD event. The generation of this magnetic field may be accomplished using an externally packaged reset unit, which may be battery powered if portability is required. Alternatively, the detector may be packaged with an on-board coil to generate the magnetic field, thus eliminating the need for an external reset package.

From the above, it may be seen that the present invention provides a system and method of monitoring ESD events which is both sophisticated and reusable. It also allows for remote and real time readout, as well as diagnostic measurement. Finally, the invention can be made to be sacrificial in the event of an ESD event which would likely damage the devices being monitored.

While several forms of the invention have been illustrated and described, it will also be apparent that various modifications can be made without departing from the spirit and scope of the invention. Accordingly, it is not intended that the invention be limited, except by the appended claims.

We claim:

1. An electrostatic discharge event detector for detecting a magnitude of an electrostatic discharge, comprising:

a substrate;

at least one conductor patterned from a metal layer deposited on the substrate, the conductor acting as an antenna for receiving a voltage produced by an electrostatic discharge, the received voltage inducing a current to flow through the conductor sufficient to generate a magnetic field around the conductor;

a first pair of magneto-optic elements having a first magnetic state formed spaced apart by a first distance on the substrate such that the conductor is located equidistant between the magneto-optic elements;

a second pair of magneto-optic elements having a first magnetic state formed spaced apart by a second distance that is larger than the first distance on the substrate such that the conductor is located equidistant between the magneto-optic elements;

wherein the first and second pairs of magneto-optic elements are capable of switching from the first magnetic state to a second magnetic in response to a magnetic field having a field strength that exceeds a predetermined field strength at the location of the magneto-optic elements; and wherein the magnitude of the electrostatic discharge may be determined from the magnetic state of the magneto-optic elements.

* * * * *